(12) United States Patent
Koike et al.

(10) Patent No.: US 12,514,133 B2
(45) Date of Patent: Dec. 30, 2025

(54) MAGNETIC STORAGE DEVICE

(71) Applicant: Kioxia Corporation, Tokyo (JP)

(72) Inventors: Takeo Koike, Yokohama Kanagawa (JP); Rina Nomoto, Tokyo (JP); Hiroyuki Kanaya, Yokohama Kanagawa (JP); Masahiko Nakayama, Yokohama Kanagawa (JP); Daisuke Watanabe, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 397 days.

(21) Appl. No.: 18/178,469

(22) Filed: Mar. 3, 2023

(65) Prior Publication Data

US 2024/0090344 A1  Mar. 14, 2024

(30) Foreign Application Priority Data

Sep. 14, 2022 (JP) .................. 2022-145992

(51) Int. Cl.
| | |
|---|---|
| *H10N 50/85* | (2023.01) |
| *H01F 10/32* | (2006.01) |
| *H10B 61/00* | (2023.01) |
| *H10N 50/20* | (2023.01) |

(52) U.S. Cl.
CPC ............. *H10N 50/85* (2023.02); *H10B 61/00* (2023.02); *H10N 50/20* (2023.02); *H01F 10/329* (2013.01)

(58) Field of Classification Search
CPC ..... H10B 61/00; H10B 61/10; H01F 10/3254; H01F 10/3259; H01F 10/3286; H01F 10/329
See application file for complete search history.

(56) References Cited

U.S. PATENT DOCUMENTS

| | | |
|---|---|---|
| 8,236,576 B2 | 8/2012 | Han et al. |
| 8,289,663 B2 | 10/2012 | Zhang et al. |
| 8,680,632 B2 | 3/2014 | Daibou et al. |

(Continued)

OTHER PUBLICATIONS

Mariana Derzsi et al., "Structures of Late Transition Metal Monoxides from Jahn-Teller Instabilities in the Rock Salt Lattice" Physical Review Letters 113, 025505 (2014), The American Physical Society, Jul. 11, 2014, pp. 1-5.

(Continued)

*Primary Examiner* — Edward Chin
(74) *Attorney, Agent, or Firm* — Kim & Stewart LLP

(57) ABSTRACT

A magnetic storage device includes first and second magnetic layers and a non-magnetic layer, where the non-magnetic layer includes a first oxide layer containing magnesium and oxygen, a second oxide layer containing magnesium and oxygen, a third oxide layer containing zinc and oxygen, a fourth oxide layer containing a first predetermined element and oxygen, and a fifth oxide layer containing a second predetermined element and oxygen, and a crystal structure of an oxide of the first predetermined element and a crystal structure of an oxide of the second predetermined element are each a rock salt structure. The first predetermined element and the second predetermined element each have an oxide formation free energy greater than an oxide formation free energy of zinc, and the oxide of the first predetermined element and the oxide of the second predetermined element each have a bandgap narrower than a bandgap of an oxide of magnesium.

5 Claims, 11 Drawing Sheets

(56) References Cited

U.S. PATENT DOCUMENTS

| | | | |
|---|---|---|---|
| 10,256,394 | B2 | 4/2019 | Omine et al. |
| 11,170,806 | B2 * | 11/2021 | Zheng .................... H10N 50/01 |
| 2008/0138660 | A1 | 6/2008 | Parkin |
| 2012/0241881 | A1 | 9/2012 | Daibou et al. |
| 2014/0159177 | A1 | 6/2014 | Daibou et al. |
| 2014/0264673 | A1 | 9/2014 | Kitagawa et al. |
| 2014/0284592 | A1 | 9/2014 | Nagamine et al. |
| 2015/0076635 | A1 | 3/2015 | Daibou et al. |
| 2018/0268887 | A1 | 9/2018 | Endo et al. |
| 2020/0220071 | A1 * | 7/2020 | Guo .................... G11C 11/1659 |
| 2020/0313084 | A1 * | 10/2020 | Ouellette ................ H10B 61/22 |
| 2022/0223783 | A1 * | 7/2022 | Jeong .................. H10B 61/00 |
| 2022/0384711 | A1 * | 12/2022 | Li .......................... H01F 10/32 |

OTHER PUBLICATIONS

J. A. McLeod et al., "Band gaps and electronic structure of alkaline-earth and post-transition-metal oxides" Physical Review B 81, 245123 (2010), The American Physical Society, Jun. 22, 2010, pp. 1-9.

* cited by examiner

MAGNETIC STORAGE DEVICE

CROSS-REFERENCE TO RELATED APPLICATION

This application is based upon and claims the benefit of priority from Japanese Patent Application No. 2022-145992, filed Sep. 14, 2022, the entire contents of which are incorporated herein by reference.

FIELD

Embodiments described herein relate generally to a magnetic storage device.

BACKGROUND

A magnetic storage device in which a magnetoresistive effect element is integrated on a semiconductor substrate has been proposed.

DETAILED DESCRIPTION

Embodiments provide a magnetic storage device including a magnetoresistive effect element having excellent characteristics.

In general, according to one embodiment, there is provided a magnetic storage device that includes a first magnetic layer having a variable magnetization direction, a second magnetic layer having a fixed magnetization direction, and a non-magnetic layer provided between the first magnetic layer and the second magnetic layer, where the non-magnetic layer includes a first oxide layer provided between the first magnetic layer and the second magnetic layer and containing magnesium (Mg) and oxygen (O), a second oxide layer provided between the second magnetic layer and the first oxide layer and containing magnesium (Mg) and oxygen (O), a third oxide layer provided between the first oxide layer and the second oxide layer and containing zinc (Zn) and oxygen (O), a fourth oxide layer provided between the first magnetic layer and the first oxide layer and containing a first predetermined element and oxygen (O), and a fifth oxide layer provided between the second magnetic layer and the second oxide layer and containing a second predetermined element and oxygen (O). A crystal structure of an oxide of the first predetermined element and a crystal structure of an oxide of the second predetermined element are each a rock salt structure. The first predetermined element and the second predetermined element each have an oxide formation free energy greater than an oxide formation free energy of zinc (Zn), and the oxide of the first predetermined element and the oxide of the second predetermined element each have a bandgap narrower than a bandgap of an oxide of magnesium (Mg).

Embodiments will be described below with reference to the drawings.

First Embodiment

Figure 1:
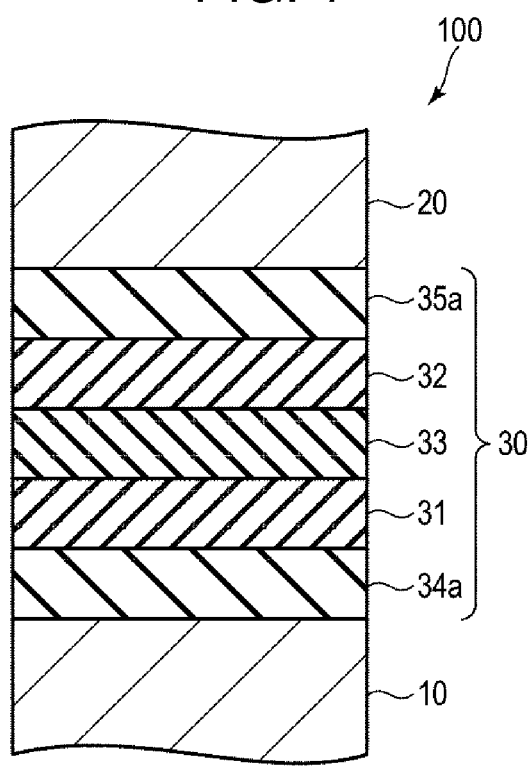
FIG. 1 is a cross-sectional view schematically illustrating a configuration of a magnetic storage device according to a first embodiment.

FIG. 1 is a cross-sectional view schematically illustrating a configuration of a magnetic storage device according to the present embodiment. Specifically, FIG. 1 is a cross-sectional view schematically illustrating a configuration of a magnetoresistive effect element 100. The magnetoresistive effect element 100 is a magnetic tunnel junction (MTJ) element.

The magnetoresistive effect element 100 is provided on a lower structure (not illustrated) of a magnetic storage device, that includes a semiconductor substrate (not illustrated), and includes a storage layer 10, which is a magnetic layer, a reference layer 20, which is a magnetic layer, and a tunnel barrier layer (30, which is a non-magnetic layer.

The storage layer 10 is a ferromagnetic layer with variable magnetization direction and includes an FeCoB layer containing iron (Fe), cobalt (Co), and boron (B). The variable magnetization direction means that the magnetization direction changes with respect to a predetermined write current flowing therethrough.

The reference layer 20 is a ferromagnetic layer with a fixed magnetization direction and includes an FeCoB layer containing iron (Fe), cobalt (Co) and boron (B). The fixed magnetization direction means that the magnetization direction does not change with respect to the predetermined write current flowing therethrough.

The tunnel barrier layer 30 is an insulating layer provided between the storage layer 10 and the reference layer 20. The tunnel barrier layer 30 includes an oxide layer 31 provided between the storage layer 10 and the reference layer 20, an oxide layer 32 provided between the reference layer 20 and the oxide layer 31, an oxide layer 33 provided between the oxide layer 31 and the oxide layer 32, an oxide layer 34a provided between the storage layer 10 and the oxide layer 31, and an oxide layer 35a provided between the reference layer 20 and the oxide layer 32. The tunnel barrier layer 30 will be described below in detail.

The magnetoresistive effect element 100 is in a low resistance state when a magnetization direction of the storage layer 10 is parallel to a magnetization direction of the reference layer 20. Further, the magnetoresistive effect element 100 is in a high resistance state when the magnetization direction of the storage layer 10 is antiparallel to the magnetization direction of the reference layer 20. Due to such characteristics, the magnetoresistive effect element 100 can store binary data according to its resistance state (low resistance state, high resistance state).

The magnetoresistive effect element 100 is a spin transfer torque (STT) type magnetoresistive effect element having perpendicular magnetization, and the magnetization direction of the storage layer 10 is perpendicular to its major surface and the magnetization direction of the reference layer 20 is perpendicular to its major surface.

The tunnel barrier layer 30 will be described below in detail.

The oxide layer 31 is formed of an MgO layer containing magnesium (Mg) and oxygen (O). That is, the oxide layer 31 is made of a monoxide of magnesium (Mg). The oxide layer 31 is in contact with the oxide layer 33 and the oxide layer 34a.

The oxide layer 32 is formed of an MgO layer containing magnesium (Mg) and oxygen (O). That is, the oxide layer 32 is made of a monoxide of magnesium (Mg). The oxide layer 32 is in contact with the oxide layer 33 and the oxide layer 35a.

The oxide layer 33 is formed of a ZnO layer containing zinc (Zn) and oxygen (O). That is, the oxide layer 33 is formed of a monoxide of zinc (Zn). The oxide layer 33 is in contact with the oxide layer 31 and the oxide layer 32.

The oxide layer 34a is formed of an XO layer containing a predetermined element X and oxygen (O). That is, the oxide layer 34a is formed of a monoxide of the predetermined element X. The predetermined element X is preferably iron (Fe). The oxide layer 34a is in contact with the oxide layer 31 and the storage layer 10.

The oxide layer 35a is formed of an XO layer containing a predetermined element X and oxygen (O). That is, the oxide layer 35a is formed of a monoxide of the predetermined element X. The predetermined element X is preferably iron (Fe). The oxide layer 35a is in contact with the oxide layer 32 and the reference layer 20.

The predetermined element X in the oxide layer 34a and the predetermined element X in the oxide layer 35a may be the same or different. In the present embodiment, the predetermined element X in the oxide layer 34a and the predetermined element X in the oxide layer 35a are the same.

With the configuration as described above, in the present embodiment, the tunnel barrier layer 30 having excellent properties can be obtained and a magnetoresistive effect element having excellent characteristics can be obtained as described below.

A consideration from first-principles calculations and thermochemical E-model predict that a tunnel barrier layer having a structure in which a ZnO layer is interposed between MgO layers has a higher breakdown voltage than a tunnel barrier layer formed of only MgO layer.

However, it was confirmed that Zn segregates in a vicinity of an interface between the storage layer and the tunnel barrier layer and in a vicinity of an interface between the reference layer and the tunnel barrier layer when heat treatment is performed after forming a structure in which a ZnO layer is interposed between MgO layers. As described below, this is probably because a structure in which a ZnO layer is interposed between a magnetic layer (storage layer, reference layer) and an MgO layer is more stable in terms of energy than a structure in which the ZnO layer is interposed between MgO layers.

Zn is more stable when not bonded to oxygen than Mg. The magnetic layer is formed of an FeCoB layer or the like and does not contain oxygen. Therefore, a stable state is that Zn is located near the interface between the magnetic layer and the tunnel barrier layer and Mg is located in a center of the tunnel barrier layer. Therefore, it is considered that the ZnO layer is located near the interface between the magnetic layer and the tunnel barrier layer and the MgO layer is located in the center of the tunnel barrier layer by heat treatment or the like.

In the present embodiment, the oxide layer 34a formed of the XO layer is located between the storage layer 10 and the oxide layer 31 formed of an MgO layer, and the oxide layer 35a formed of the XO layer is located between the reference layer 20 and the oxide layer 32 formed of an MgO layer. This allows the oxide layer 33 formed of a ZnO layer to be stably located between the oxide layer 31 and the oxide layer 32. Preferred conditions required for the predetermined element X will be described below.

First, a first condition will be described. A crystal structure of MgO used as the oxide layers 31 and 32 is a B1 structure (rock salt structure). Therefore, a crystal structure of XO used as the oxide layers 34a and 35a is also preferably the B1 structure. That is, it is preferable that a crystal structure of a mono-oxide XO of the predetermined element X be the B1 structure. Here, the B1 structure also includes a distorted B1 structure.

Next, a second condition will be described. As described above, Zn is stable when it is not bound to oxygen. In other words, Zn has a large oxide formation free energy. In the present embodiment, the XO layer is provided near an interface between the magnetic layer and the tunnel barrier layer to prevent the ZnO layer from being located near an interface between the magnetic layer and the tunnel barrier layer. Therefore, the oxide formation free energy of the predetermined element X is preferably higher than the oxide formation free energy of Zn. Specifically, a formation free energy of a monoxide (XO) of the predetermined element X is preferably higher than a formation free energy of a monoxide (ZnO) of Zn.

Figure 2:
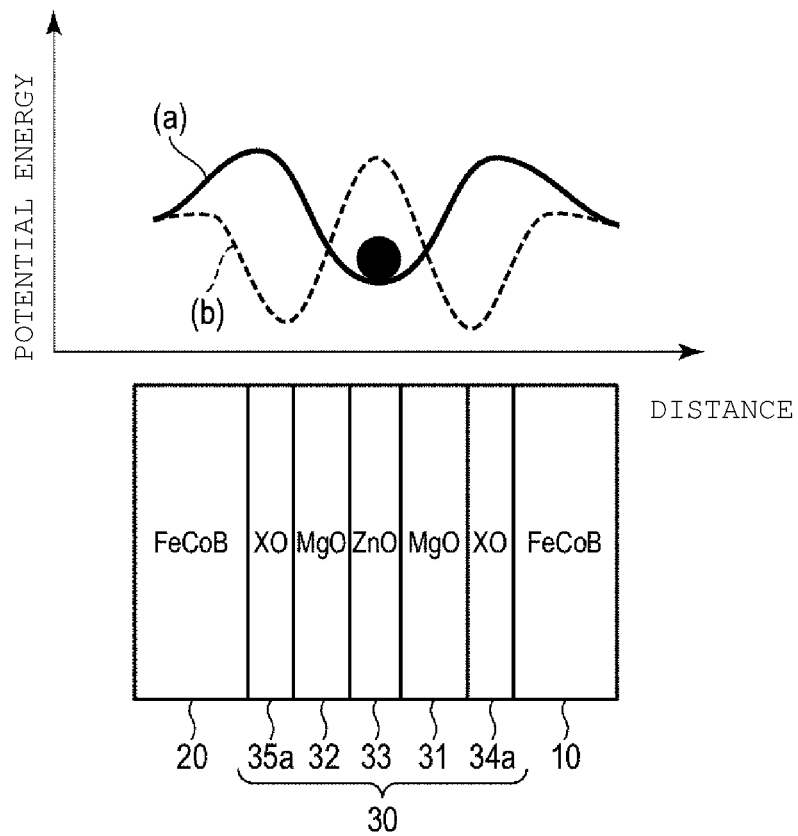
FIG. 2 is a diagram schematically illustrating a potential energy for Zn in a tunnel barrier layer according to the first embodiment.

FIG. 2 is a diagram schematically illustrating a potential energy for Zn in the tunnel barrier layer 30. In FIG. 2, a characteristic (a) corresponds to the case where the oxide layers 34a and 35a formed of the monoxide (XO) of the predetermined element X satisfying the second condition are provided, and a characteristic (b) corresponds to the case where the oxide layers 34a and 35a are not provided. Characteristic (b) shows a potential energy that is low near the storage layer (FeCoB layer) 10 and near the reference layer (FeCoB layer) 20, while characteristic (a) shows a potential energy that is low at a position corresponding to the oxide layer (ZnO layer) 33. Therefore, by providing the oxide layers 34a and 35a made of XO, the oxide layer 33 made of ZnO can be stably located between the oxide layers 31 and 32 made of MgO.

Next, a third condition will be described. When a bandgap of XO is wider than the bandgap of MgO, the resistance of the tunnel barrier layer 30 will increase. Therefore, it is preferable that a bandgap of the oxide of the predetermined element X is narrower than a bandgap of the oxide of Mg. Specifically, the bandgap of the monoxide (XO) of the predetermined element X is preferably narrower than the bandgap of the monoxide (MgO) of Mg.

Figure 3:
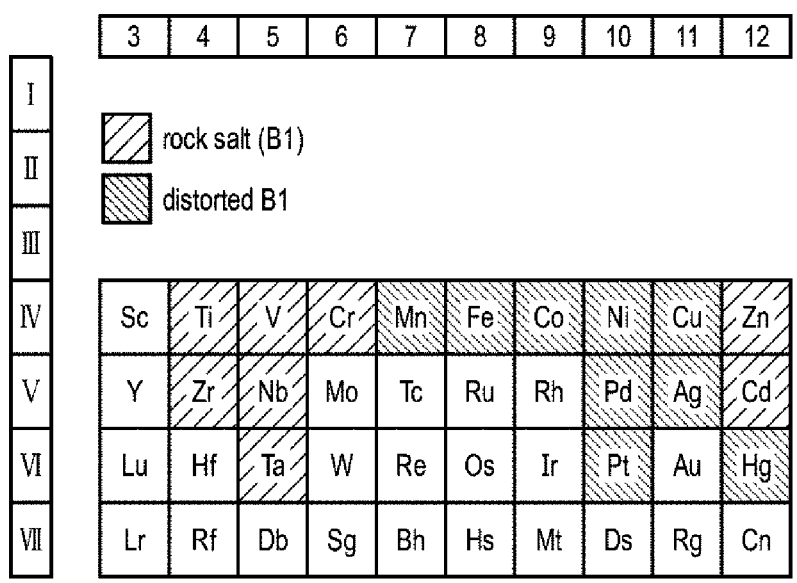
FIG. 3 is a diagram illustrating whether monoxides of various elements illustrated in a periodic table have a B1 structure.

FIG. 3 is a diagram illustrating whether monoxides of various elements illustrated in a periodic table have a B1 structure (rock salt structure). In FIG. 3, a monoxide of each of the marked elements has a B1 structure (including a distorted B1 structure).

Figure 4:
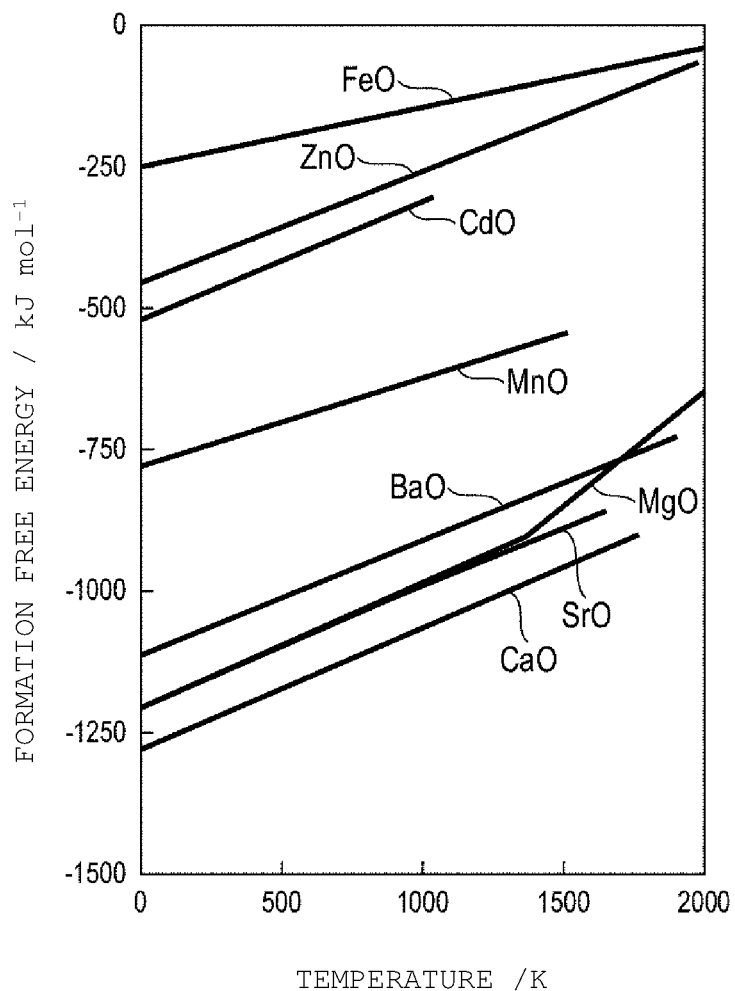
FIG. 4 is an Ellingham diagram illustrating formation free energies of monoxides of various elements.

FIG. 4 is an Ellingham diagram illustrating formation free energies (standard formation Gibbs energies) of monoxides of various elements. A horizontal axis is a temperature and a vertical axis is a formation free energy. As can be seen from FIG. 4, at least in a temperature range illustrated in FIG. 4, a formation free energy of a monoxide (FeO) of iron (Fe) is greater than a formation free energy of a monoxide (ZnO) of Zn.

Figure 5:
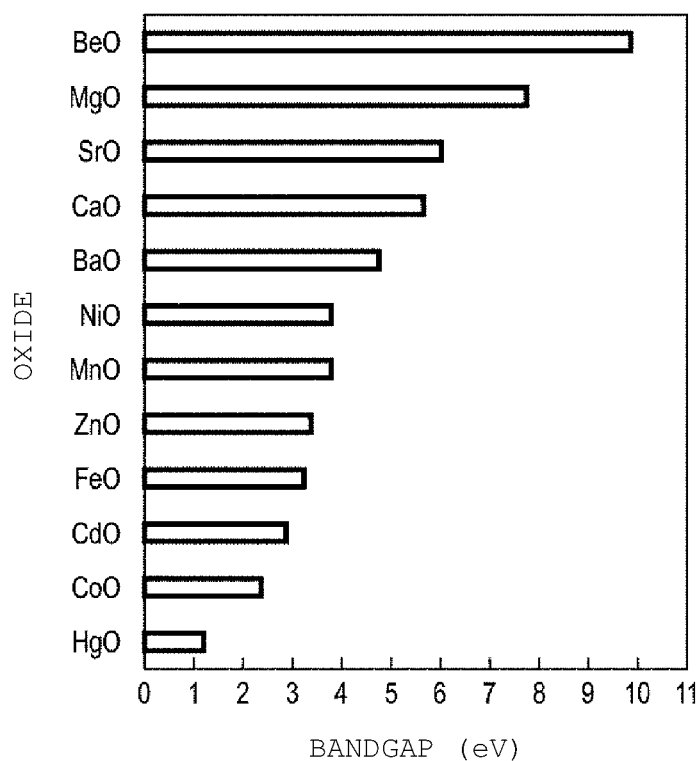
FIG. 5 is a diagram illustrating bandgaps of monoxides of various elements.

FIG. 5 is a diagram illustrating bandgaps of monoxides of various elements. As illustrated in FIG. 5, the bandgap of a monoxide (FeO) of iron (Fe) is narrower than the bandgap of a monoxide (MgO) of Mg.

Based on the above considerations, iron (Fe) is selected as the predetermined element X that satisfies the first, second and third conditions.

As described above, in the present embodiment, by using the oxide layers 34a and 35a containing the predetermined element X and oxygen (O), it is possible to obtain the tunnel barrier layer 30 having excellent properties with a high withstand voltage and an energetically stable structure. Therefore, it is possible to obtain a magnetoresistive effect element having excellent characteristics.

Figure 6:
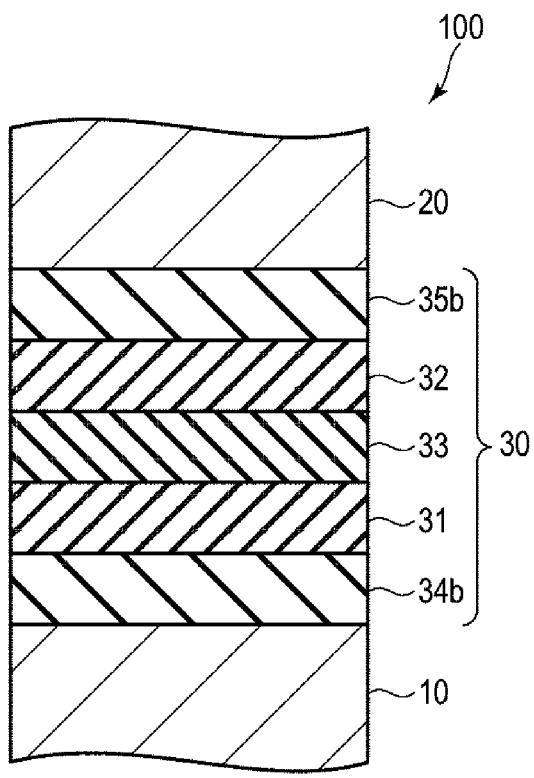
FIG. 6 is a cross-sectional view schematically illustrating a configuration of a magnetic storage device according to a first modification example of the first embodiment.

FIG. 6 is a cross-sectional view schematically illustrating a configuration of a magnetic storage device according to a first modification example of the present embodiment.

In the present modification example, oxide layers 34b and 35b are formed of $Mg_{1-\alpha}X_{\alpha}O$ layer (where $0<\alpha<1$) containing magnesium (Mg) in addition to a predetermined element X (preferably iron (Fe)) and oxygen (O). That is, the oxide layers 34b and 35b are formed of a monoxide containing magnesium (Mg), the predetermined element X, and oxygen (O). It is preferable that a concentration of magnesium (Mg) in the oxide layer 34b decrease as a distance from the oxide layer 31 increases, and a concentration of magnesium (Mg) in the oxide layer 35b decrease as a distance from the oxide layer 32 increases.

Also in the present modification example, by providing the oxide layers 34b and 35b containing the predetermined element X, it is possible to obtain the same effects as in the above-described embodiment.

Figure 7:
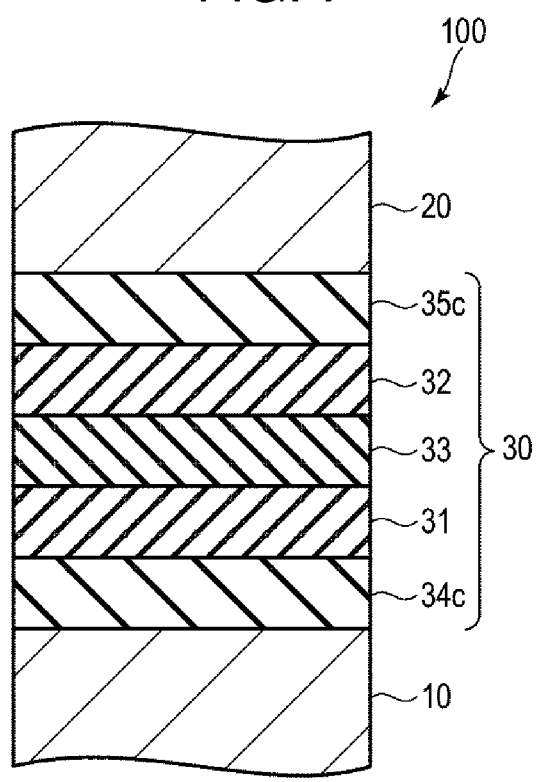
FIG. 7 is a cross-sectional view schematically illustrating a configuration of a magnetic storage device according to a second modification example of the first embodiment.

FIG. 7 is a cross-sectional view schematically illustrating a configuration of a magnetic storage device according to a second modification example of the present embodiment.

Also in the present modification example, oxide layers 34c and 35c contain predetermined elements X (preferably iron (Fe)) and oxygen (O). It is noted that, in the present modification example, a composition ratio of the predetermined element X and oxygen (O) is not 1:1, and the oxide layers 34c and 35c are formed of $X_{1-\alpha}O_{\alpha}$ layers (where $0<\alpha<1$). Thus, the oxide layers 34c and 35c need not be monoxides.

Also in the present modification example, by providing oxide layers 34c and 35c containing the predetermined element X, it is possible to obtain the same effects as in the above-described embodiment.

Figure 8:
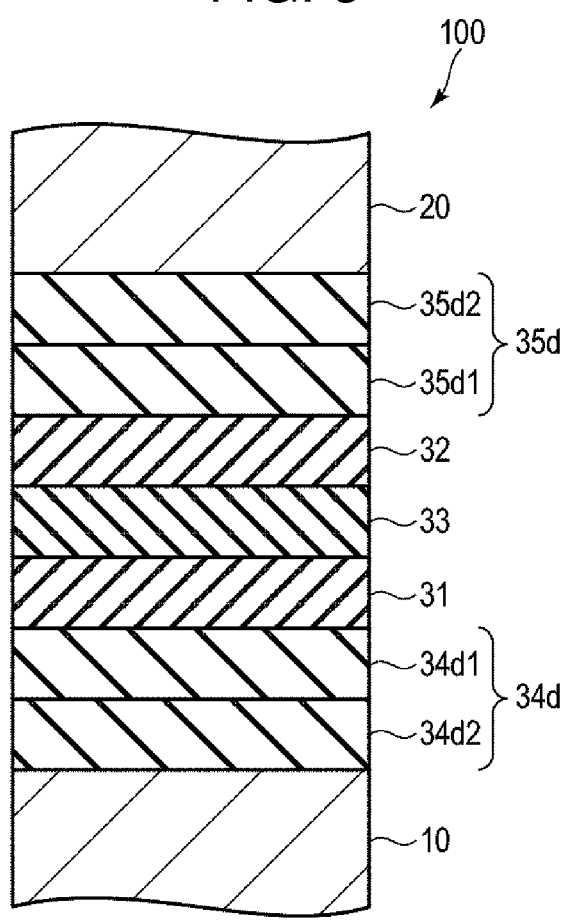
FIG. 8 is a cross-sectional view schematically illustrating a configuration of a magnetic storage device according to a third modification example of the first embodiment.

FIG. 8 is a cross-sectional view schematically illustrating a configuration of a magnetic storage device according to a third modification example of the present embodiment.

Also in the present modification example, oxide layers 34d and 35d contain predetermined elements X (preferably iron (Fe)) and oxygen (O). It is noted that, in the present modification example, the oxide layer 34d includes an oxide layer 34d1 and an oxide layer 34d2, and the oxide layer 35d includes an oxide layer 35d1 and an oxide layer 35d2.

A basic configuration of the oxide layers 34d1 and 35d1 is similar to the configuration of the oxide layers 34a and 35a illustrated in FIG. 1. That is, the oxide layers 34d1 and 35d1 are formed of an XO layer (monoxide layer of predetermined element X) containing the predetermined element X and oxygen (O).

A basic configuration of the oxide layers 34d2 and 35d2 is similar to the configuration of the oxide layers 34c and 35c illustrated in FIG. 7. That is, the oxide layers 34d2 and 35d2 are formed of $X_{1-\alpha}O_{\alpha}$ layers (where $0<\alpha<1$) containing the predetermined element X and oxygen (O).

Also in the present modification example, by providing oxide layers 34d and 35d containing the predetermined element X, it is possible to obtain the same effects as in the above-described embodiment.

Figure 9:
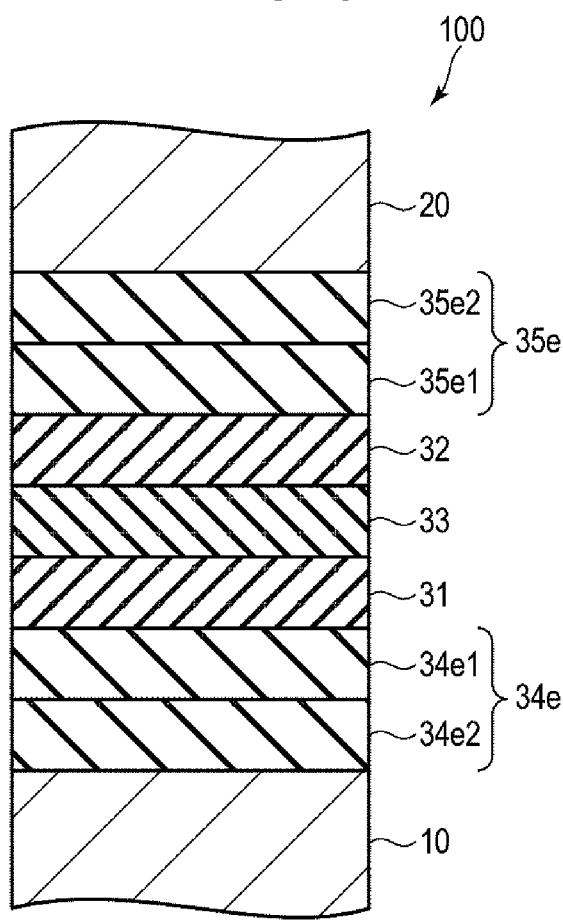
FIG. 9 is a cross-sectional view schematically illustrating a configuration of a magnetic storage device according to a fourth modification example of the first embodiment.

FIG. 9 is a cross-sectional view schematically illustrating a configuration of a magnetic storage device according to a fourth modification example of the present embodiment.

Also in the present modification example, oxide layers 34e and 35e contain predetermined elements X (preferably iron (Fe)) and oxygen (O). It is noted that, in the modification example, the oxide layer 34e includes an oxide layer 34e1 and an oxide layer 34e2, and the oxide layer 35e includes an oxide layer 35e1 and an oxide layer 35e2.

A basic configuration of the oxide layers 34e1 and 35e1 is similar to the configuration of the oxide layers 34b and 35b illustrated in FIG. 6. That is, the oxide layers 34e1 and 35e1 are formed of $Mg_{1-\alpha}X_{\alpha}O$ layers (where $0<\alpha<1$) containing magnesium (Mg), the predetermined elements X, and oxygen (O). As described in the first modification example, it is preferable that a concentration of magnesium (Mg) in the oxide layer 34e1 decrease as a distance from the oxide layer 31 increases, and a concentration of magnesium (Mg) in the oxide layer 35e1 decreases as the distance from the oxide layer 32 increases.

A basic configuration of the oxide layers 34e2 and 35e2 is similar to the configuration of the oxide layers 34a and 35a illustrated in FIG. 1 or the configuration of the oxide layers 34c and 35c illustrated in FIG. 7. That is, the oxide layers 34e2 and 35e2 are formed of $X_{1-\alpha}O_{\alpha}$ layers (where $0<\alpha<1$) containing the predetermined elements X and oxygen (O) and substantially not containing magnesium (Mg).

Also in the present modification example, by providing oxide layers 34e and 35e containing the predetermined element X, it is possible to obtain the same effects as in the above-described embodiment.

Second Embodiment

Next, a second embodiment will be described. Basic matters are the same as those of the first embodiment, and the description of the matters described in the first embodiment is omitted.

Figure 10:
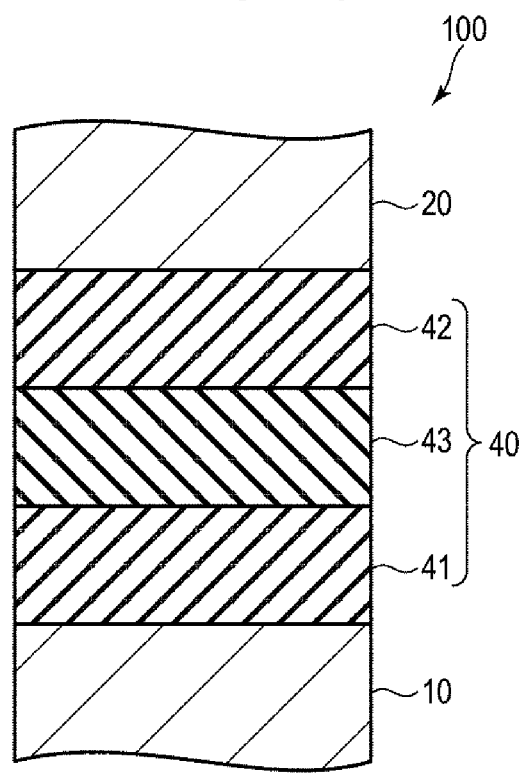
FIG. 10 is a cross-sectional view schematically illustrating a configuration of a magnetic storage device according to a second embodiment.

FIG. 10 is a cross-sectional view schematically illustrating a configuration of a magnetic storage device according to the present embodiment. Specifically, FIG. 10 is a cross-sectional view schematically illustrating a configuration of the magnetoresistive effect element 100. The magnetoresistive effect element 100 is a magnetic tunnel junction (MTJ) element.

As similar to the first embodiment, the magnetoresistive effect element 100 is provided on a lower structure (not illustrated) of the magnetic storage device, that includes a semiconductor substrate (not illustrated), and includes the storage layer 10, the reference layer (20, and a tunnel barrier layer 40, which is non-magnetic.

In the present embodiment, the tunnel barrier layer 40 includes an oxide layer 41 provided between the storage layer 10 and the reference layer 20, an oxide layer 42 provided between the reference layer 20 and the oxide layer 41, and an oxide layer 43 provided between the oxide layer 41 and the oxide layer 42.

The oxide layer 41 is formed of an MgO layer containing magnesium (Mg) and oxygen (O). That is, the oxide layer 41 is made of a monoxide of magnesium (Mg). The Oxide layer 41 is in contact with the storage layer 10 and the oxide layer 43.

The oxide layer 42 is formed of an MgO layer containing magnesium (Mg) and oxygen (O). That is, the oxide layer 42 is formed of a monoxide of magnesium (Mg). The oxide layer 42 is in contact with the reference layer 20 and the oxide layer 43.

The oxide layer 43 is formed of a $Zn_{1-\alpha}Y_\alpha O$ layer (where $0<\alpha<1$) containing zinc (Zn), a predetermined element Y, and oxygen (O). That is, the oxide layer 43 is formed of a monoxide containing zinc (Zn), the predetermined element Y, and oxygen (O). The predetermined element Y is preferably selected from cadmium (Cd), manganese (Mn), barium (Ba), strontium (Sr), and calcium (Ca). The oxide layer 43 is in contact with the oxide layer 41 and the oxide layer 42.

With the configuration as described above, in the present embodiment, the tunnel barrier layer 40 having excellent properties can be obtained and a magnetoresistive effect element having excellent characteristics can be obtained as described below.

As described in the first embodiment, the tunnel barrier layer having a structure in which a ZnO layer is interposed between MgO layers has a high breakdown voltage, but is energetically unstable.

In the present embodiment, the oxide layer 43 formed of a $Zn_{1-\alpha}Y_\alpha O$ layer containing zinc (Zn), the predetermined element Y, and oxygen (O) is located between the oxide layer 41 formed of an MgO layer and the oxide layer 42 formed of an MgO layer. As a result, the oxide layer 43 formed of the $Zn_{1-\alpha}Y_\alpha O$ layer can be stably located between the oxide layer 41 and the oxide layer 42. Preferred conditions required for the predetermined element Y are described below.

First, a first condition will be described. As described in the first embodiment, Zn has a large oxide formation free energy. In the present embodiment, by forming the oxide layer 43 with a $Zn_{1-\alpha}Y_\alpha O$ layer containing the predetermined element Y in addition to zinc (Zn) and oxygen (O), the oxide layer 43 is stably located between the oxide layer 41 and the oxide layer 42. Therefore, the oxide formation free energy of the predetermined element Y is preferably smaller than the oxide formation free energy of Zn. Specifically, the formation free energy of the monoxide (YO) of the predetermined element Y is preferably smaller than the formation free energy of the monoxide (ZnO) of Zn.

Figure 11:
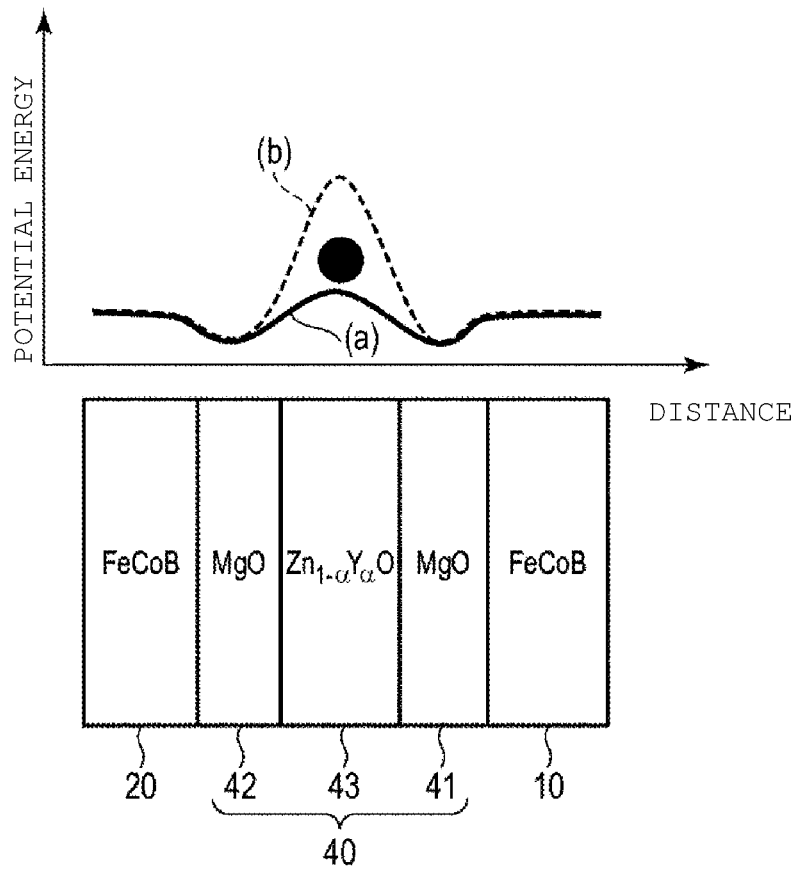
FIG. 11 is a diagram schematically illustrating a potential energy for $Zn_{1-\alpha}Y_\alpha$ in a tunnel barrier layer according to the second embodiment.

FIG. 11 is a diagram schematically illustrating a potential energy for $Zn_{1-\alpha}Y_\alpha$ in the tunnel barrier layer 40. In FIG. 11, a characteristic (a) corresponds to the case where the oxide layer 43 is formed of a $Zn_{1-\alpha}Y_\alpha O$ layer containing the predetermined element Y that satisfies the first condition, and a characteristic (b) corresponds to the case where the oxide layer 43 is formed of a ZnO layer containing no predetermined element Y. As illustrated in FIG. 11, at a position corresponding to the oxide layer 43, the characteristic (a) shows a lower potential energy than the characteristic (b). Therefore, by forming the oxide layer 43 from the $Zn_{1-\alpha}Y_\alpha O$ layer, the oxide layer 43 can stably exist between the oxide layers 41 and 42 formed from MgO.

Next, a second condition will be described. When a bandgap of $Zn_{1-\alpha}Y_\alpha O$ is wider than a bandgap of MgO, the resistance of the tunnel barrier layer 40 will increase. Therefore, it is preferable that the bandgap of $Zn_{1-\alpha}Y_\alpha O$ be narrower than the bandgap of MgO. As illustrated in FIG. 5, the bandgap of ZnO is narrower than the bandgap of MgO. Therefore, when a bandgap of YO is narrower than the bandgap of MgO, the bandgap of $Zn_{1-\alpha}Y_\alpha O$ is also narrower than the bandgap of MgO. Therefore, it is preferable that a bandgap of an oxide of the predetermined element Y be narrower than a bandgap of an oxide of Mg. Specifically, it is preferable that a bandgap of the monoxide (YO) of the predetermined element Y be narrower than a bandgap of the monoxide (MgO) of Mg.

As can be seen from FIG. 4, at least in a temperature range illustrated in FIG. 4, each of the formation free energies of monoxides (CdO, MnO, BaO, SrO, and CaO) of cadmium (Cd), manganese (Mn), barium (Ba), strontium (Sr), and calcium (Ca) is smaller than the free formation energy of the monoxide (ZnO) of Zn.

As illustrated in FIG. 5, each of the bandgaps of monoxides (CdO, MnO, BaO, SrO, and CaO) of cadmium (Cd), manganese (Mn), barium (Ba), strontium (Sr), and calcium (Ca) is narrower than the bandgap of the monoxide (MgO) of Mg.

Based on the above considerations, cadmium (Cd), manganese (Mn), barium (Ba), strontium (Sr), and calcium (Ca) are selected as the predetermined elements Y that satisfy the first and second conditions.

In addition, in the present embodiment, it is not always necessary to satisfy a condition (that a crystal structure of the monoxide YO of the predetermined element Y is the B1 structure) corresponding to the first condition described in the first embodiment. As illustrated in FIG. 3, Cd and Mn satisfy such conditions, and Ba, Sr and Ca do not. In the present embodiment, it is important that an original crystal structure of ZnO does not collapse when the predetermined element Y is added to ZnO. Cd, Mn, Ba, Sr, and Ca described above can prevent the original crystal structure of ZnO from collapsing even when added to ZnO.

Figure 12:
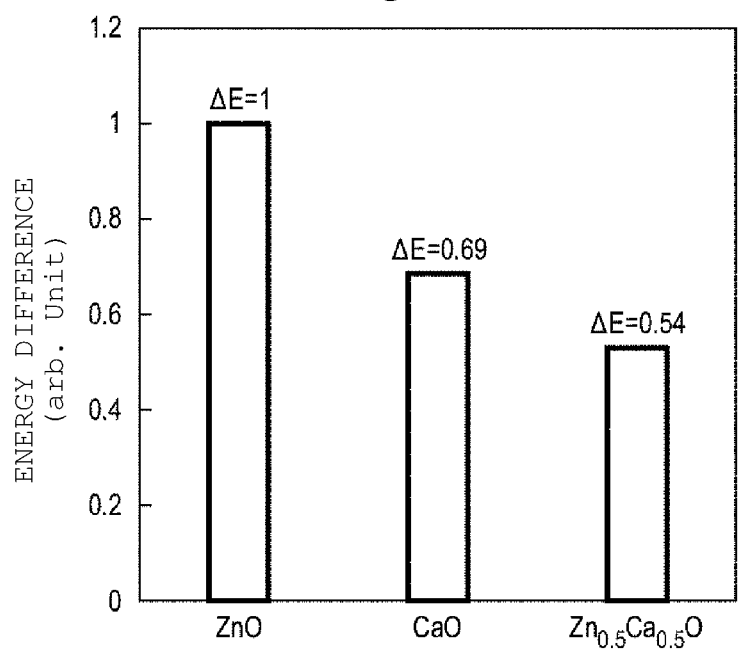
FIG. 12 is a diagram illustrating a calculation results of an energy difference between energy in a system where an oxide layer is located between MgO layers and energy in a system where the oxide layer is located near an interface between an MgO layer and a magnetic layer.

FIG. 12 is a diagram illustrating a calculation results of an energy difference ΔE (ΔE=E1−E2) between an energy E1 in a system where an oxide layer A (the oxide layer A is a ZnO layer, a CaO layer, or a $Zn_{0.5}Ca_{0.5}O$ layer) is located between MgO layers and an energy E2 in a system where the oxide layer A is located near an interface between an MgO layer and a magnetic layer (Fe layer). In FIG. 12, the value of the energy difference ΔE for the ZnO layer is normalized to 1. A larger value of the energy difference ΔE indicates that the oxide layer A is more easily stabilized in the vicinity of the interface.

As illustrated in FIG. 12, the $Zn_{0.5}Ca_{0.5}O$ layer has the smallest energy difference ΔE. Therefore, it can be seen that the $Zn_{0.5}Ca_{0.5}O$ layer is less stable near the interface between the MgO layer and the magnetic layer than the ZnO layer and the CaO layer. In other words, it can be seen that the $Zn_{0.5}Ca_{0.5}O$ layer is more easily stabilized between the MgO layers than the ZnO layer and the CaO layer.

Therefore, by forming the oxide layer 43 from a $Zn_{1-\alpha}Ca_{\alpha}O$ layer, it is possible to stably locate the oxide layer 43 between the oxide layers 41 and 42 formed from MgO. For other predetermined elements Y (Cd, Mn, Ba, Sr), similarly to Ca, it is conceived that, by forming the oxide layer 43 from a $Zn_{1-\alpha}Y_{\alpha}O$ layer, it is possible to stably locate the oxide layer 43 between the oxide layers 41 and 42 formed from MgO.

As described above, in the present embodiment, by using a $Zn_{1-\alpha}Y_{\alpha}O$ layer containing zinc (Zn), the predetermined element Y, and oxygen (O) as the oxide layer 43, as in the first embodiment, it is possible to obtain the tunnel barrier layer 40 having excellent properties with a high breakdown voltage and an energetically stable structure. Therefore, it is possible to obtain a magnetoresistive effect element having excellent characteristics.

Figure 13:
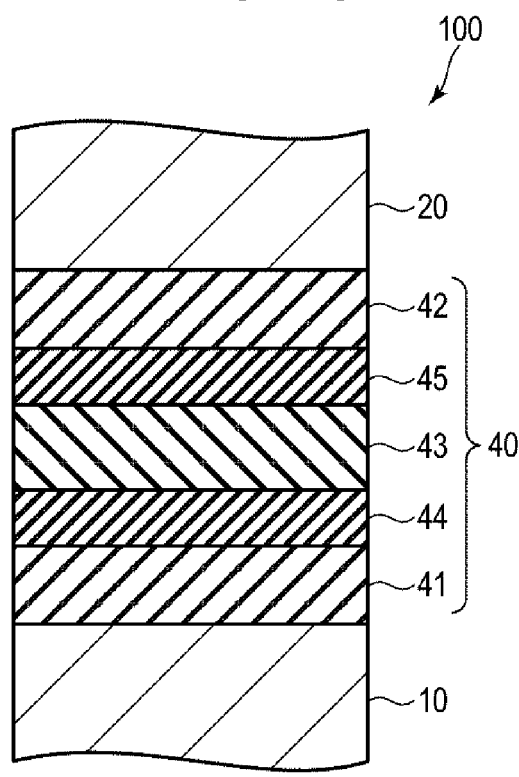
FIG. 13 is a cross-sectional view schematically illustrating a configuration of a magnetic storage device according to a first modification example of the second embodiment.

FIG. 13 is a cross-sectional view schematically illustrating a configuration of a magnetic storage device (the configuration of the magnetoresistive effect element 100) according to a first modification example of the present embodiment.

In the present modification example, an oxide layer 44 is provided between the oxide layer 41 and the oxide layer 43 and an oxide layer 45 is provided between the oxide layer 42 and the oxide layer 43. A basic configuration of the oxide layers 41, 42, and 43 is similar to that of the embodiments described above. The oxide layers 44 and 45 contain predetermined elements Y and oxygen (O) and substantially do not contain zinc (Zn). Specifically, the oxide layers 44 and 45 are formed of monoxides (YO) of the predetermined element Y (preferably Cd, Mn, Ba, Sr, or Ca).

Also in the present modification example, by using a $Zn_{1-\alpha}Y_{\alpha}O$ layer containing zinc (Zn), the predetermined element Y, and oxygen (O) as the oxide layer 43, it is possible to obtain the same effects as in the embodiment described above.

Figure 14:
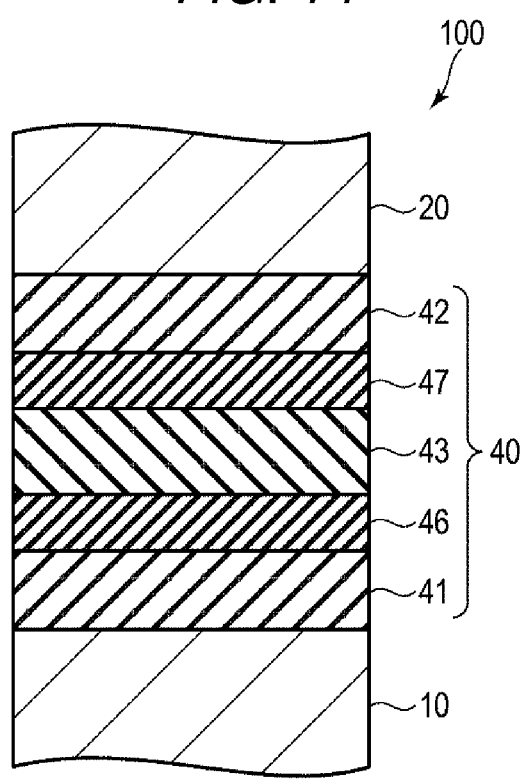
FIG. 14 is a cross-sectional view schematically illustrating a configuration of a magnetic storage device according to a second modification example of the second embodiment.

FIG. 14 is a cross-sectional view schematically illustrating a configuration (the configuration of the magnetoresistive effect element 100) of a magnetic storage device according to a second modification example of the present embodiment.

In the present modification example, an oxide layer 46 is provided between the oxide layer 41 and the oxide layer 43 and an oxide layer 47 is provided between the oxide layer 42 and the oxide layer 43. A basic configuration of the oxide layers 41, 42, and 43 is the same as in the embodiment described above. The oxide layers 46 and 47 are formed of $Mg_{1-\alpha}Y_{\alpha}O$ (where $0<\alpha<1$) containing magnesium (Mg), a predetermined element Y, and oxygen (O). That is, the oxide layers 46 and 47 are formed of monoxides containing magnesium (Mg) and the predetermined element Y. It is preferable that a concentration of magnesium (Mg) in the oxide layer 46 decrease as a distance from the oxide layer 41 increases, and a concentration of magnesium (Mg) in the oxide layer 47 decrease as a distance from the oxide layer 42 increases.

Also in the present modification example, by using the $Zn_{1-\alpha}Y_{\alpha}O$ layer containing zinc (Zn), the predetermined element Y, and oxygen (O) as the oxide layer 43, it is possible to obtain the same effects as in the embodiment described above.

Although in the first and second embodiments described above, a bottom-free type magnetoresistive effect element in which the storage layer 10 is located on a lower layer side of the reference layer 20 is illustrated, it is also possible to use a top-free type magnetoresistive effect element in which the storage layer 10 is located on an upper layer side of the reference layer 20.

Figure 15:
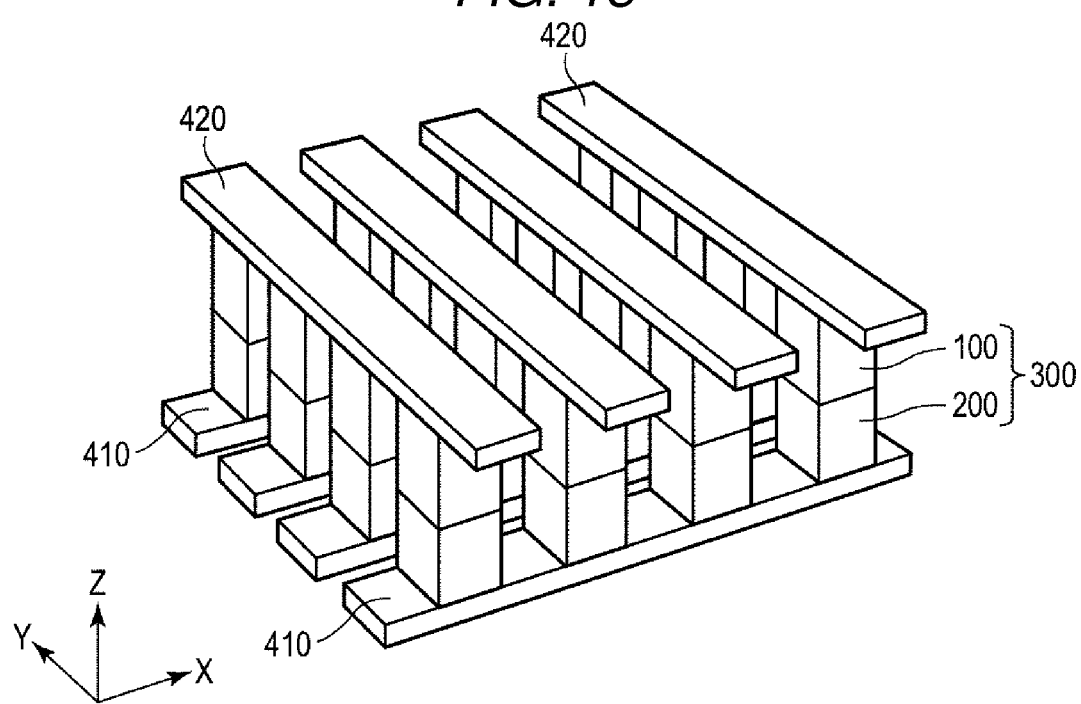
FIG. 15 is a perspective view schematically illustrating a configuration of a magnetic storage device according to an application example of a magnetoresistive effect element described in the first and second embodiments.

FIG. 15 is a perspective view schematically illustrating a configuration of a magnetic storage device according to an application example of the magnetoresistive effect element 100 described in the first and second embodiments.

A memory cell 300 is provided between a first wiring 410 extending in an X direction and a second wiring 420 extending in a Y direction. The memory cell 300 includes the magnetoresistive effect element 100 described in the first and second embodiments and a selector (which is a switching element) 200 connected in series with the magnetoresistive effect element 100. One of the first wiring 410 and the second wiring 420 corresponds to a word line, and the other of the first wiring 410 and the second wiring 420 corresponds to a bit line.

The X direction, the Y direction, and a Z direction illustrated in FIG. 15 are directions that intersect each other. Specifically, the X, Y, and Z directions are orthogonal to each other.

The selector 200 is a two-terminal type switching element having a nonlinear current-voltage characteristic, and has a characteristic of switching from an OFF state to an ON state when a voltage applied between the two terminals exceeds a threshold voltage. Therefore, when a voltage is applied between the first wiring 410 and the second wiring 420 and the voltage applied to the selector 200 exceeds the threshold voltage, the selector 200 transitions from the OFF state to the ON state. As a result, a current flows through the magnetoresistive effect element 100 and the selector 200, making it possible to write to or read from the magnetoresistive effect element 100.

By applying a magnetoresistive effect element 100 described in the first and second embodiments to the magnetic storage device illustrated in FIG. 15, it is possible to obtain a magnetic storage device having excellent characteristics.

Although FIG. 15 illustrates the configuration in which the magnetoresistive effect element 100 is provided on an upper layer side of the selector 200, it is also possible to use a configuration in which the magnetoresistive effect element 100 is provided on a lower layer side of the selector 200.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic storage device that includes a first magnetic layer having a variable magnetization direction, a second magnetic layer having a fixed magnetization direction, and a non-magnetic layer provided between the first magnetic layer and the second magnetic layer, the non-magnetic layer including:
   a first oxide layer provided between the first magnetic layer and the second magnetic layer and containing magnesium (Mg) and oxygen (O), a second oxide layer provided between the second magnetic layer and the first oxide layer and containing magnesium (Mg) and oxygen (O), a third oxide layer provided between the first oxide layer and the second oxide layer and containing zinc (Zn) and oxygen (O), a fourth oxide layer provided between the first magnetic layer and the first oxide layer and containing iron (Fe) and oxygen (O), and a fifth oxide layer provided between the second magnetic layer and the second oxide layer and containing iron (Fe) and oxygen (O).

2. The magnetic storage device according to claim 1, wherein the fourth oxide layer includes a layer containing iron (Fe), magnesium (Mg), and oxygen (O), and the fifth oxide layer includes a layer containing iron (Fe), magnesium (Mg), and oxygen (O).

3. The magnetic storage device according to claim 2, wherein a concentration of magnesium (Mg) in the layer containing iron (Fe), magnesium (Mg), and oxygen (O) in the fourth oxide layer decreases as a distance from the first oxide layer increases, and a concentration of magnesium (Mg) in the layer containing iron (Fe), magnesium (Mg), and oxygen (O) in the fifth oxide layer decreases as a distance from the second oxide layer increases.

4. The magnetic storage device according to claim 1, wherein the fourth oxide layer includes a layer containing iron (Fe), magnesium (Mg), and oxygen (O), and a layer containing iron (Fe) and oxygen (O) and substantially no magnesium (Mg), and the fifth oxide layer includes a layer containing iron (Fe), magnesium (Mg), and oxygen (O), and a layer containing iron (Fe) and oxygen (O) and substantially no magnesium (Mg).

5. The magnetic storage device according to claim 1, wherein the first magnetic layer and the second magnetic layer each contain iron (Fe), cobalt (Co), and boron (B).

* * * * *